(12) United States Patent
Kwak

(10) Patent No.: US 7,786,586 B2
(45) Date of Patent: Aug. 31, 2010

(54) INDUCTOR OF SEMICONDUCTOR DEVICE AND METHOD FOR MANUFACTURING THE SAME

(75) Inventor: Sung-Ho Kwak, Yeoju-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 44 days.

(21) Appl. No.: 12/199,475

(22) Filed: Aug. 27, 2008

(65) Prior Publication Data
US 2009/0057824 A1     Mar. 5, 2009

(30) Foreign Application Priority Data
Aug. 31, 2007   (KR)   ................. 10-2007-0088249

(51) Int. Cl.
*H01L 23/48*     (2006.01)
*H01L 21/336*   (2006.01)
(52) U.S. Cl. ..................................... 257/758; 438/304

(58) Field of Classification Search ................. None
See application file for complete search history.

(56) References Cited

U.S. PATENT DOCUMENTS

| | | | |
|---|---|---|---|
| 6,429,504 B1* | 8/2002 | Beaussart et al. | 257/531 |
| 6,660,645 B1* | 12/2003 | Bell et al. | 438/706 |
| 2006/0038295 A1* | 2/2006 | Faust et al. | 257/758 |
| 2006/0110901 A1* | 5/2006 | Lu et al. | 438/597 |

* cited by examiner

*Primary Examiner*—Charles D Garber
*Assistant Examiner*—Andre' C Stevenson
(74) *Attorney, Agent, or Firm*—Sherr & Vaughn, PLLC

(57) ABSTRACT

An inductor of a semiconductor device and a method for manufacturing the same are disclosed. The inductor has a spiral structure, and includes a semiconductor substrate formed with a sub-structure. At least one metal line layer may be formed over the semiconductor substrate. At least one inductor line layer may be formed over the metal line layer. A space layer may be formed between the inductor line layer and the semiconductor substrate.

14 Claims, 9 Drawing Sheets

US 7,786,586 B2

INDUCTOR OF SEMICONDUCTOR DEVICE AND METHOD FOR MANUFACTURING THE SAME

Figure 1:
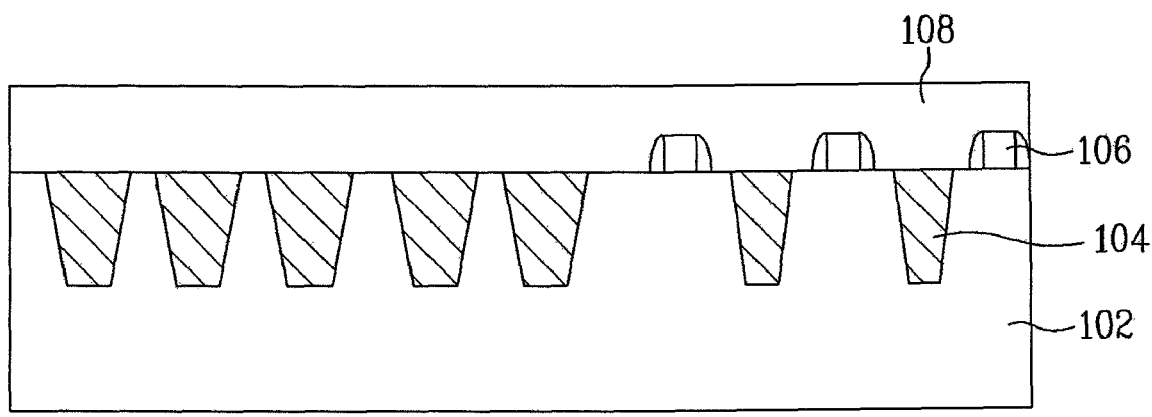

The present application claims priority under 35 U.S.C. 119 to Korean Patent Application No. 10-2007-0088249 (filed on Aug. 31, 2007), which is hereby incorporated by reference in its entirety.

BACKGROUND

Generally, an inductor is needed in designing a radio-frequency integrated circuit (RF IC), for impedance matching. The quality factor and inductance of an inductor are important factors which determine the performance of a matching circuit. Inductors used for impedance matching, including off-chip inductors, bond wire inductors, spiral inductors, etc. are known in the related art. The off-chip inductor has the disadvantages of relatively large size and increased manufacturing costs. Although bond wire inductors exhibit excellent characteristics, large inductance deviation caused by problems in fabrication processes is a drawback. Therefore, spiral inductors, which exhibit a small inductance deviation, are most often used.

The spiral inductor includes a silicon substrate, a plurality of metal lines formed over the silicon substrate, an insulating layer for insulating the metal lines, and an inductor line. For an inductor to achieve a high quality factor, it is necessary to reduce parasitic resistance in the metal lines, and to reduce losses due to eddy currents and displacement currents in the substrate.

Generally, in the inductor, there is a capacitance between the area of the silicon substrate occupied by the metal lines and the grounded portion of the silicon substrate because the silicon substrate has a relatively-high dielectric constant. Due to the capacitance caused by the dielectric characteristics of the silicon substrate, energy is drained from the inductor through the grounded surface at the bottom of the silicon substrate.

SUMMARY

Embodiments relate to a method for manufacturing a semiconductor device, and more particularly, to an inductor of a semiconductor device, which has an improved quality factor, and a method for manufacturing the same. Embodiments relate to an inductor of a semiconductor device and a method for manufacturing the same, which are capable of reducing energy loss through a silicon substrate, thereby achieving an enhancement in quality factor.

Embodiments relate to an inductor of a semiconductor device which includes a semiconductor substrate formed with a sub-structure. At least one metal line layer may be formed over the semiconductor substrate. At least one inductor line layer may be formed over the metal line layer. A space layer may be formed between the inductor line layer and the semiconductor substrate.

Embodiments relate to a method for manufacturing an inductor having a spiral structure which includes: preparing a semiconductor substrate formed with an sub-structure, forming at least one metal line layer over the semiconductor substrate, forming at least one inductor line layer over the metal line layer, and forming a space layer beneath the inductor metal line layer.

In the inductor of the semiconductor device according to embodiments and the manufacturing method thereof, the photoresist present between the semiconductor substrate and the inductor metal lines is removed, so that it is possible to reduce the contact area between the semiconductor substrate and the inductor metal lines and to reduce capacitance between the semiconductor substrate and the inductor metal lines. Accordingly, it is possible to avoid substrate loss, and to achieve an enhancement in quality factor. Thus, the reliability of the process and the electrical characteristics of the device can be enhanced.

DRAWINGS

Example FIGS. 1 to 15 are sectional views illustrating a method for manufacturing an inductor of a semiconductor device in accordance with embodiments.

DESCRIPTION

Example FIGS. 1 to 15 are sectional views illustrating a method for manufacturing an inductor of a semiconductor device in accordance with embodiments. Referring to example FIG. 1, a semiconductor substrate 102 is first prepared. The semiconductor substrate 102 may have a sub-structure including a plurality of device isolation films 104 formed by a shallow trench isolation (STI) process, and a plurality of transistors 106 for driving semiconductor devices. An insulating film 108 may be formed over the semiconductor substrate 102. The first insulating film 108 may be deposited using, for example, a plasma enhanced chemical vapor deposition (PECVD) method or a sputtering method. The first insulating film 108 may be made of an inorganic or organic insulating material such as a silicon oxide ($SiO_x$) or a silicon nitride ($SiN_x$).

Figure 2:
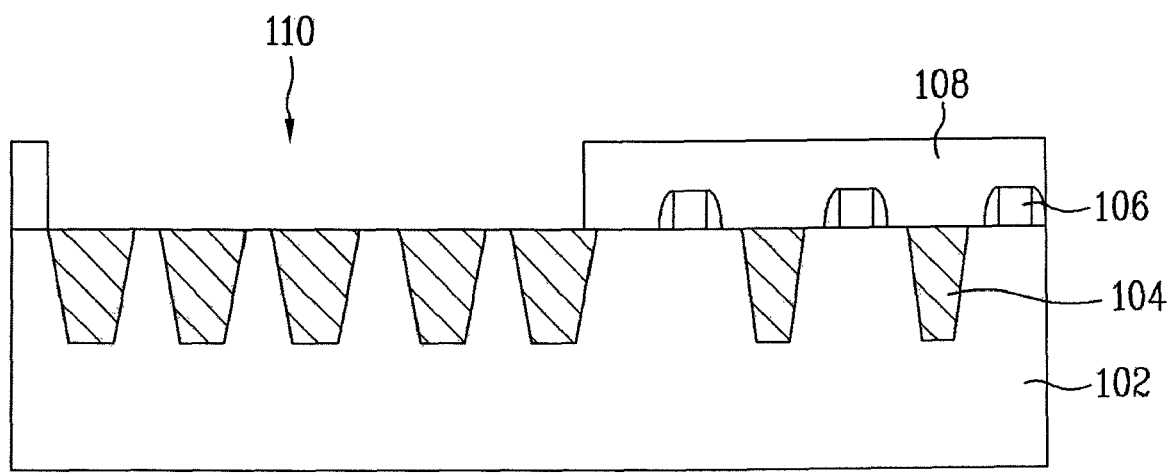
Figure 3:
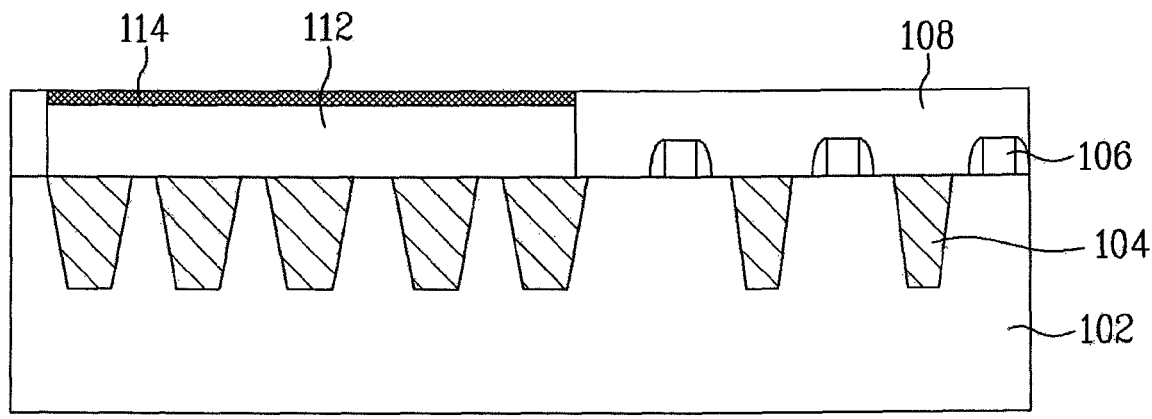

As shown in example FIG. 2, the first insulating film 108 may then be patterned, using a photolithography process, to form a first hole 110. As shown in example FIG. 3, a first photoresist 112 may be subsequently filled in the first hole 110. A first silylation film 114 may then be formed over the first photoresist 112, through a silylation process.

Figure 4:
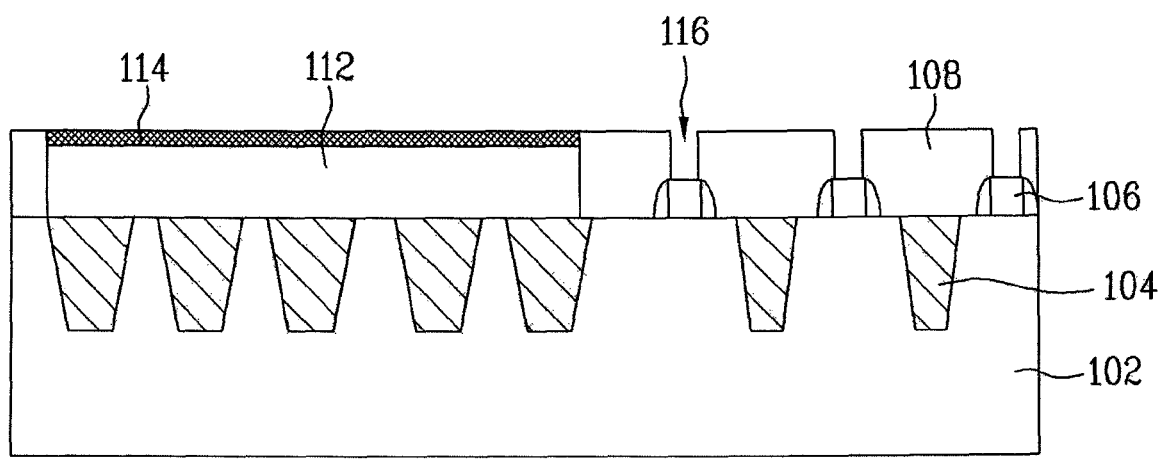
Figure 5:
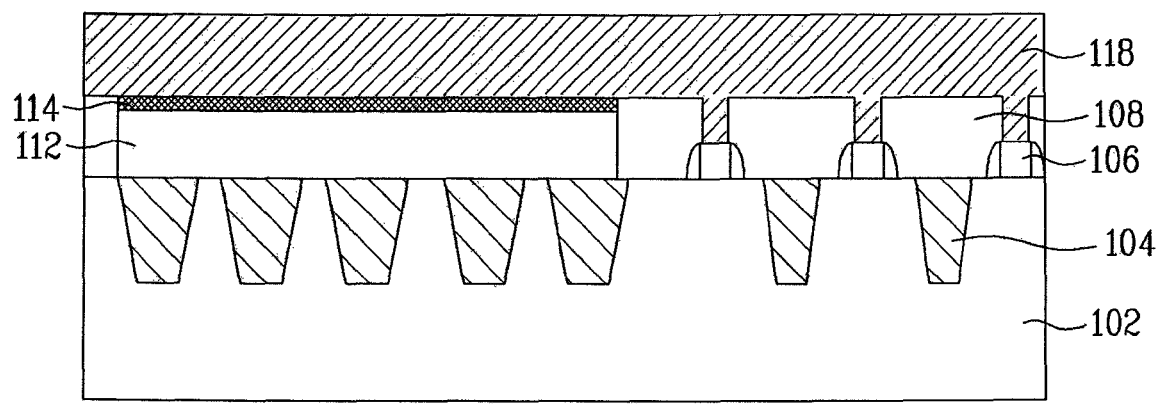

Thereafter, as shown in example FIG. 4, a photolithography process may be carried out to selectively etch the first insulating film 108, and thus to form first via holes 116, through which gate electrodes of the transistors 106 may be exposed. As shown in example FIG. 5, a first metal layer 118 may be formed over the resulting structure, to fill the first via holes 116. The first metal layer 118 may be formed by using, for example, an electrochemical plating (ECP) process. The first metal layer 118 may be made of copper (Cu), aluminum (Al), etc.

Figure 6:
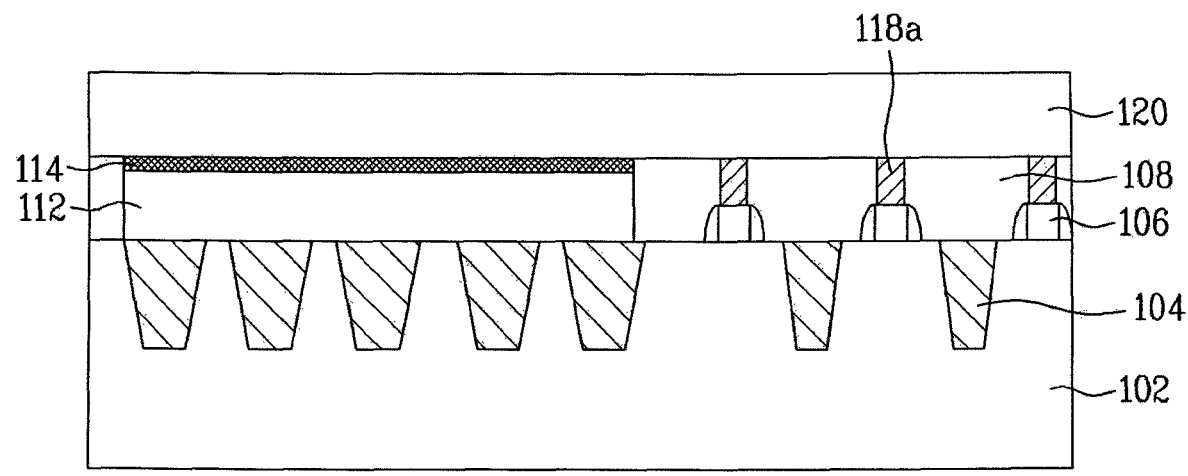

Thereafter, as shown in example FIG. 6, a chemical mechanical polishing (CMP) process may be carried out on the first metal layer 118 to expose the surface of the silylation film 114. Thus, first metal lines 118a may be formed. Each first metal line 118a may have a structure in which the first metal layer 118 is buried in the corresponding first via hole 116. Subsequently, a second insulating film 120 may be formed over the resulting surface of the insulating film 108 including the first silylation film 114 and first metal lines 118a. The second insulating film 120 may be deposited using, for example, a PECVD method or a sputtering method. The second insulating film 120 may be made of an inorganic or organic insulating material such as a silicon oxide ($SiO_x$) or a silicon nitride ($SiN_x$).

Figure 7:
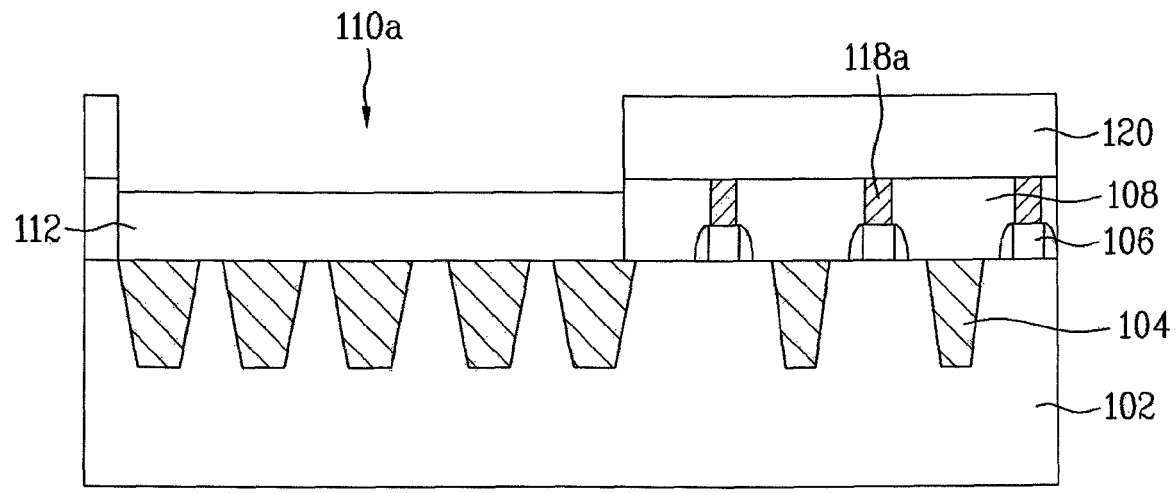
Figure 8:
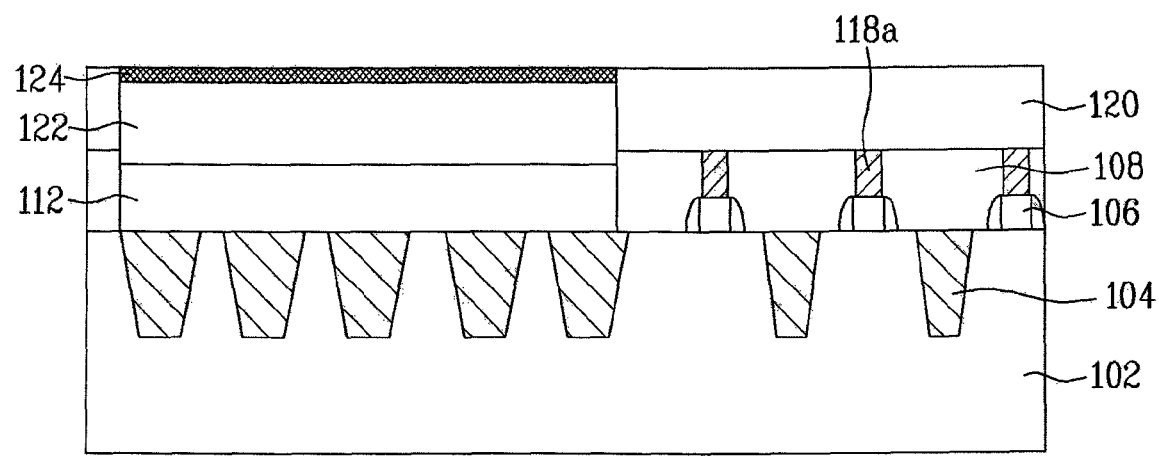

As shown in example FIG. 7, a photolithography process may be carried out to selectively etch the second insulating film 120, and thus to form a second hole 110a, through which the first photoresist 112 is exposed. As shown in example FIG. 8, a second photoresist 122 may be filled in the second hole 110a. A second silylation film 124 may be formed over the second photoresist 122, through a silylation process. For example, the second photoresist 122 and silylation film 124 may be sequentially laminated in the second hole 110a such that they fill the second hole 110a.

Figure 9:
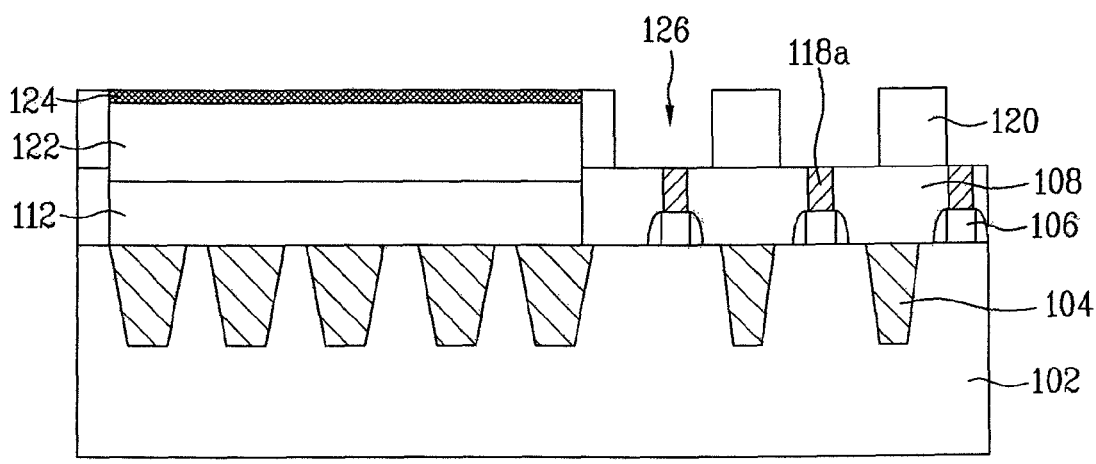
Figure 10:
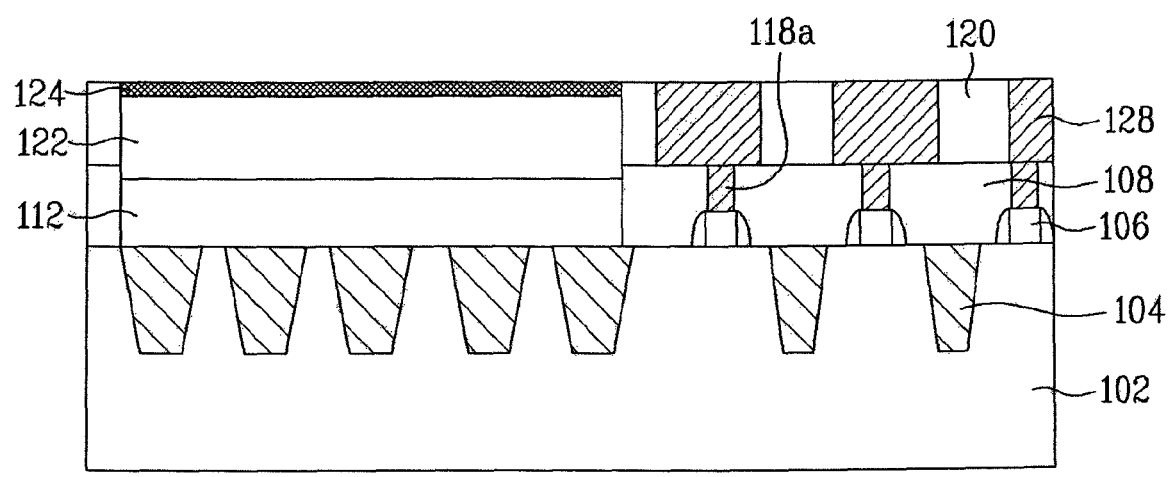

As shown in example FIG. 9, the second insulating film 120 may be selectively etched to form second via holes 126. The second via holes 126 may be formed to expose respective first metal lines 118a, and to have a width larger than that of the first via holes 118. As shown in example FIG. 10, a second metal layer may be formed over the resulting surface of the substrate, to fill the second via holes 126. The second metal layer is then planarized, using a CMP process, to expose the surface of the second silylation film 124. Thus, second metal lines 128 are formed. Each second metal line 128 has a structure in which the second metal layer is buried in the corresponding second via hole 126.

Figure 11:
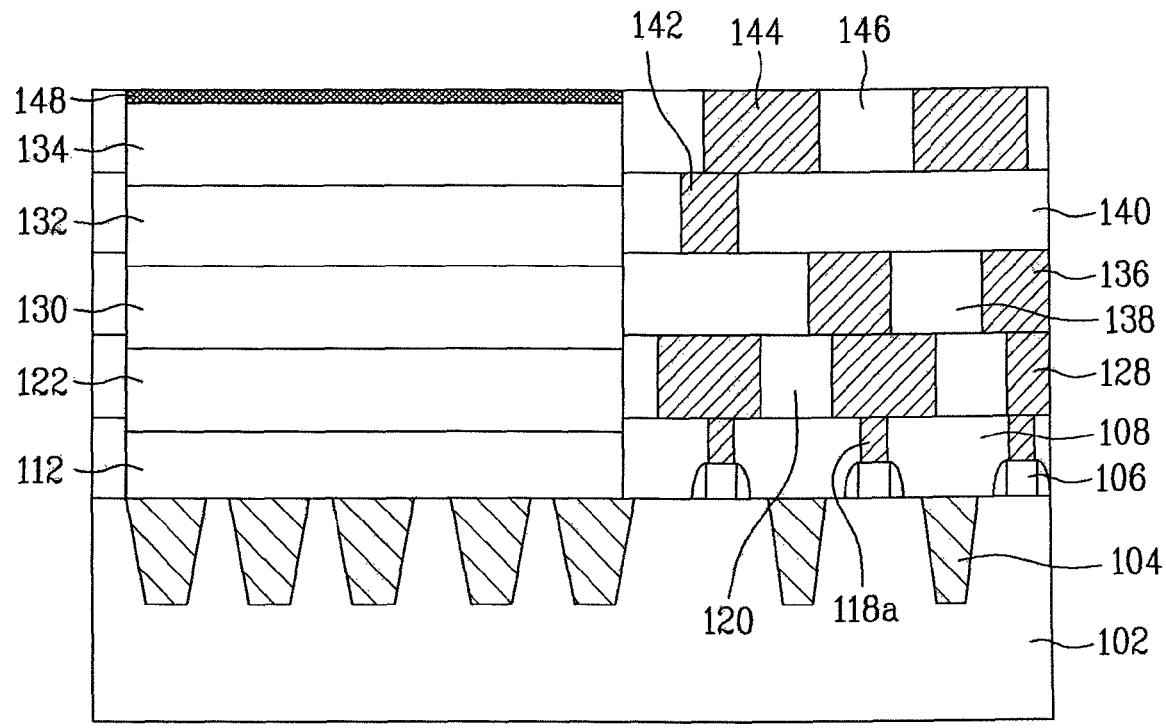

Thus, it is possible to form a plurality of metal lines in a multilayer structure formed over a semiconductor substrate, as shown in example FIG. 11, using the above-described metal line forming process. Referring to example FIG. 11, an inductor according to embodiments is illustrated. The inductor includes: a semiconductor substrate 102 with a sub-structure including device isolation films 104 and a plurality of transistors 106. A first insulating film 108 may be formed after the patterning of the first insulating film 108, and first metal lines 118a may be formed in the first insulating film 108. A second insulating film 120 may be included, with a second photoresist 122 formed after the patterning of the second insulating film 120, and second metal lines 128 formed in the second insulating film 120. The inductor may further include a third insulating film 128, a third photoresist 130 formed after the patterning of the third insulating film 138, and third metal lines 136 formed in the third insulating film 138. A fourth insulating film 140 may be included, with a fourth photoresist 132 formed after the patterning of the fourth insulating film 140, and fourth metal lines 142 formed in the fourth insulating film 140. A fifth insulating film 146 may be included, with a fifth photoresist 134 formed after the patterning of the fifth insulating film 146, and fifth metal lines 144 formed in the fifth insulating film 146, and a fifth silylation film 148 formed over the fifth photoresist 134. The first through fourth silylation films are removed in the formation processes of the second through fifth layers, respectively.

Figure 12:
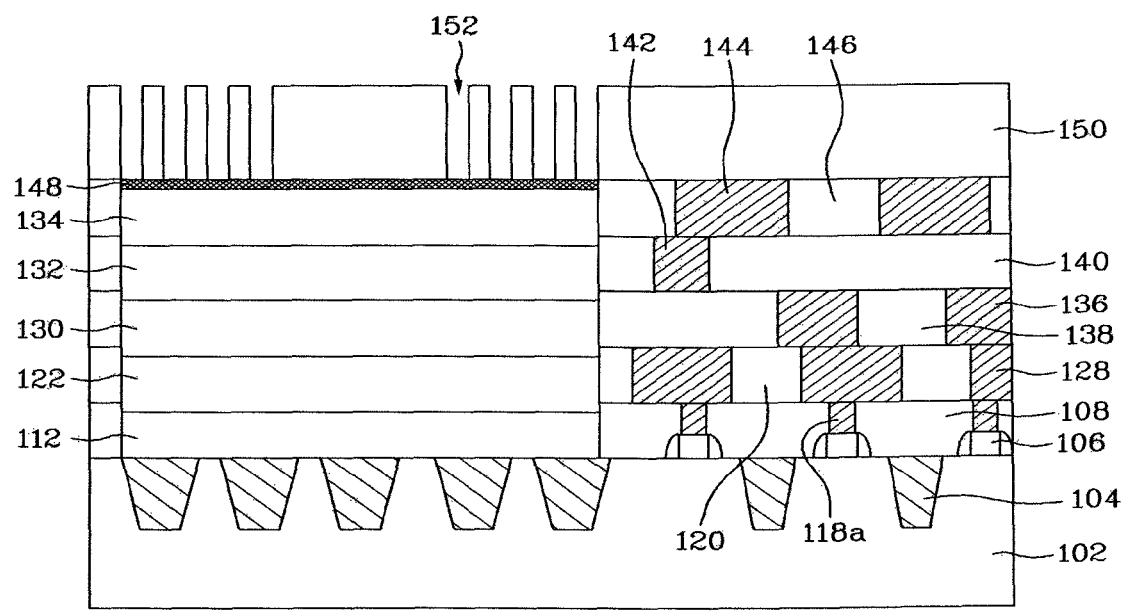

As shown in example FIG. 12, a sixth insulating film 150 may be formed over the resulting surface of the fifth insulating film 146 including the fifth silylation film 148 and fifth metal lines 144. Thereafter, the sixth insulating film 150 is patterned in accordance with a photolithography process, to form inductor holes 152, through which the fifth silylation film 148 is selectively exposed, in order to form inductor lines.

Figure 13:
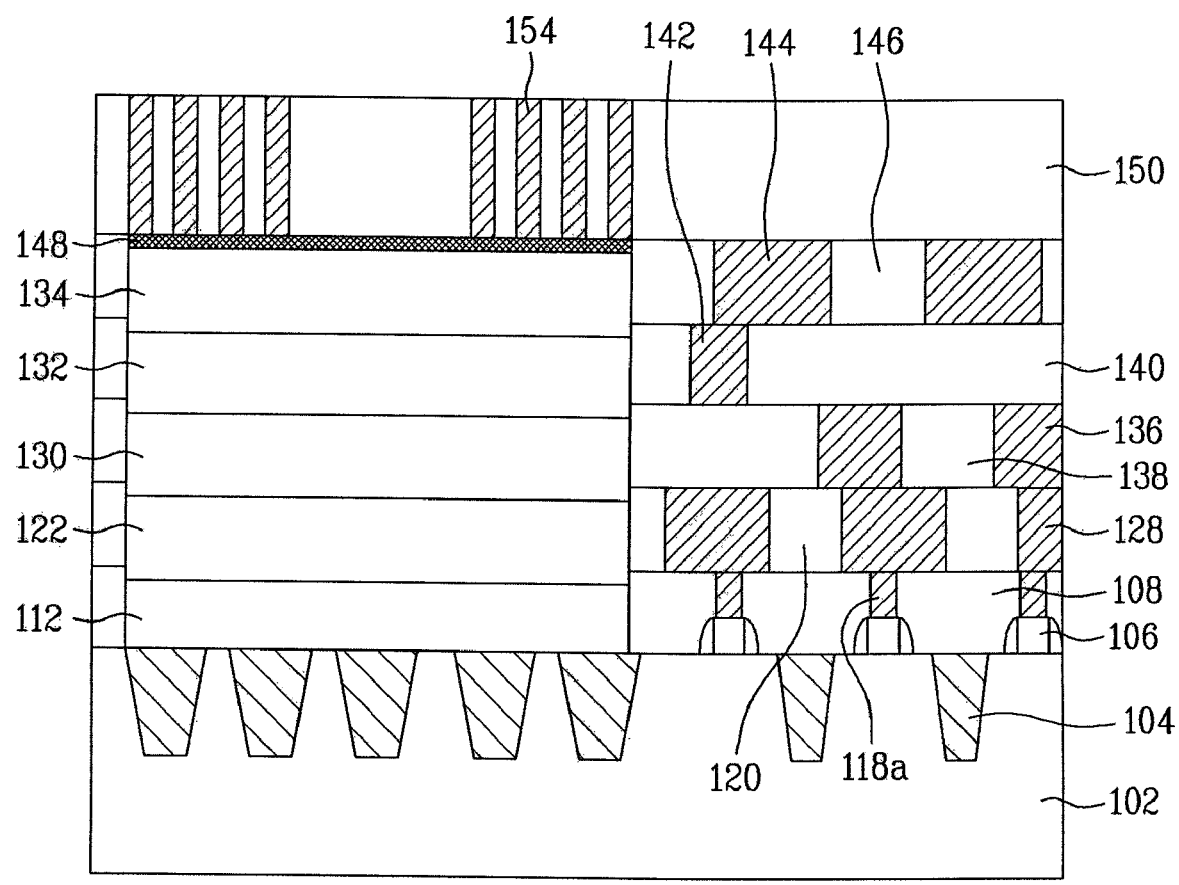

Subsequently, as shown in example FIG. 13, an inductor metal layer may be formed over the resulting surface of the sixth insulating film 150, to fill the inductor holes 152. The formation of the inductor metal layer may be achieved using an ECP process. The inductor metal layer may be made of copper (Cu), aluminum (Al), etc. The inductor metal layer may be planarized in accordance with a CMP process, to expose the surface of the sixth insulating film 150, and thus to form inductor lines 154.

Figure 14:
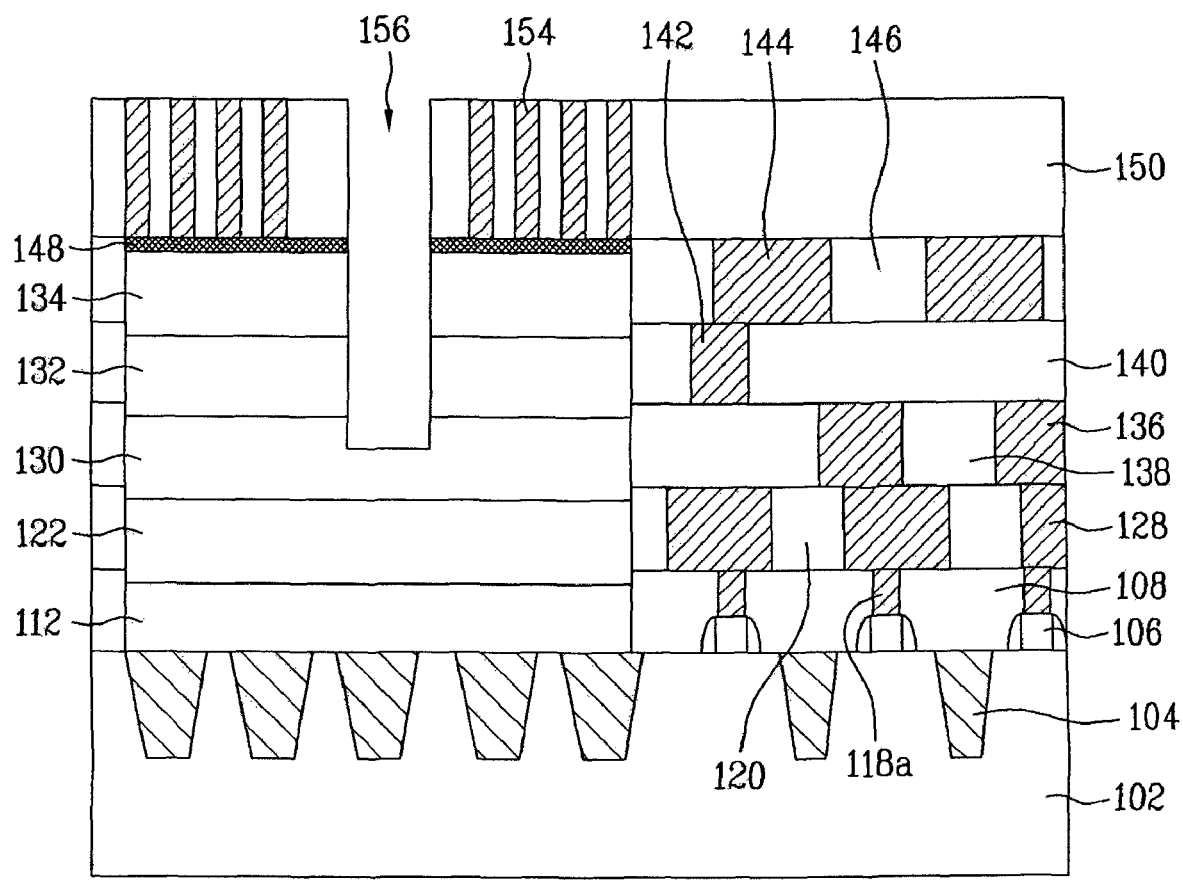

Using a photolithography process, as shown in example FIG. 14, the sixth insulating film 150 is then etched in a region which has no inductor line over the silylation film 148, to expose the fifth silylation film 148. Thereafter, the exposed fifth silylation film 148 and at least one of the plurality of photoresist layers 134, 132, 130, 122, and 122 (for example, the photoresist layers 134, 132, and 130) are selectively etched, to form a third hole 156.

Figure 15:
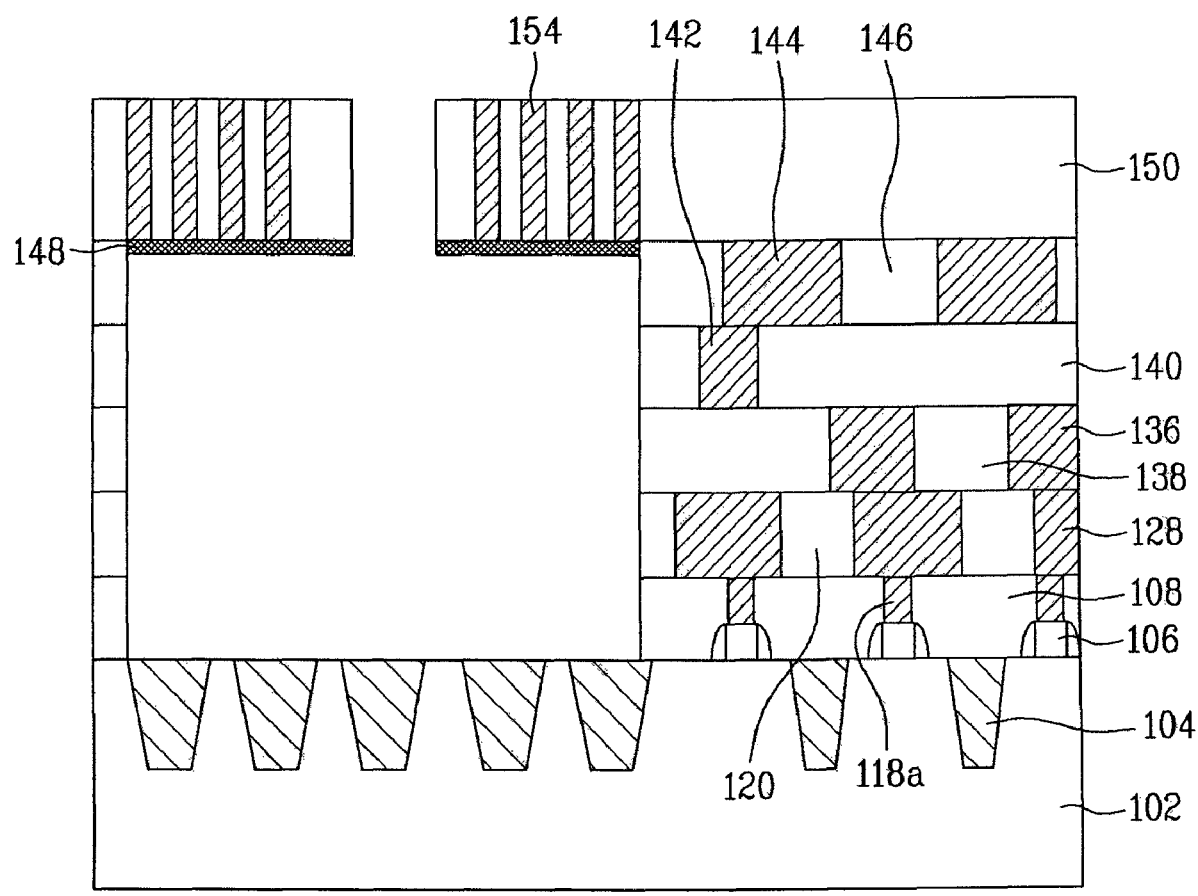

Subsequently, as shown in example FIG. 15, a wet etching process is carried out through the third hole 156, to completely remove the plurality of photoresist layers 134, 132, 130, 122, and 112 formed beneath the silylation film 148. For example, when the semiconductor substrate having third hole 156 is dipped into a wet etching solution, the wet etching solution etches the photoresist layers 134, 132, 130, 122, and 112. As a result, the photoresist layers 134, 132, 130, 122, and 112 may be removed. In this case, the wet etching solution may be a mixture of sulphuric acid and hydrogen peroxide. The mixture may have a mixture ratio of $H_2SO_4:H_2O_2=6:1$.

As the photoresist present between the semiconductor substrate and the inductor metal lines 154 may be removed in accordance with the inductor manufacturing method, it is possible to reduce the contact area between the semiconductor substrate and the inductor metal lines 154. It is thus possible to reduce the capacitance between the semiconductor substrate and the inductor metal lines 154. Accordingly, it is possible to avoid substrate loss, and to achieve an enhancement in quality factor. Thus, the reliability of the process and the electrical characteristics of the device can be enhanced.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
a semiconductor substrate formed with a sub-structure;
at least one metal line layer formed over the semiconductor substrate, the at least one metal layer including a lower metal line layer formed over the semiconductor layer and an upper metal line layer formed over the lower metal line layer;
at least one inductor line layer formed over the metal line layer; and
a space layer formed between the inductor line layer and the semiconductor substrate,
wherein the lower metal line layer includes a lower insulating film formed over an entire upper surface of the semiconductor substrate, a lower hole formed on a first side of the lower insulating film, a lower photoresist layer formed in the lower hole, a lower silylation film formed over the lower photoresist layer, a lower via hole formed on a second side of the lower insulating film, and a lower metal line buried in the lower via hole,
wherein the upper metal line layer includes an upper insulating film formed over an entire upper surface of the lower insulating film including the lower silylation film and the lower metal line, an upper hole formed in a first side of the upper insulating film to expose the lower photoresist layer, an upper photoresist layer formed in the upper hole, an upper silylation film formed over the upper photoresist layer, an upper via hole formed in a second side of the upper insulating film, and an upper metal line buried in the upper via hole.

2. The apparatus of claim 1, wherein the inductor line layer comprises:
an insulating film formed over the metal line layer;
an inductor hole formed in the insulating film; and
an inductor line buried in the inductor hole.

3. The apparatus of claim 2, wherein the inductor line has a spiral structure.

4. A method comprising:
preparing a semiconductor substrate formed with an sub-structure;
forming at least one metal line layer over the semiconductor substrate by forming a lower metal line layer over the semiconductor substrate and forming an upper metal line layer over the lower metal line layer;
forming at least one inductor line layer over the metal line layer; and
forming a space layer beneath the inductor metal line layer,
wherein forming the lower metal line layer over the semiconductor substrate comprises forming a lower insulating film over an entire upper surface of the semiconductor substrate, patterning the lower insulating film on a first side of the lower insulating film, thereby forming a lower hole, forming a lower photoresist layer formed in the lower hole, silylating the lower photoresist layer, thereby forming a lower silylation film, patterning the lower insulating film on a second side of the lower insulating film, thereby forming a lower via hole, forming a lower metal layer over an entire upper surface of the lower insulating film including the lower via hole and the lower silylation film, and subjecting the lower metal layer to a chemical mechanical polishing process such that the lower silylation film is exposed, thereby forming a lower metal line.

5. The method of claim 4, wherein the lower metal layer is formed by an electro-chemical plating process.

6. The method of claim 4, wherein said forming the upper metal line layer over the lower metal line layer comprises:
forming an upper insulating film over an entire upper surface of the semiconductor substrate including the lower metal line layer;
patterning the upper insulating film on a first side of the upper insulating film, thereby forming an upper hole;
forming an upper photoresist layer in the upper hole;
silylating the upper photoresist layer, thereby forming an upper silylation film;
patterning the upper insulating film on a second side of the upper insulating film, thereby forming an upper via hole;
forming an upper metal layer over an entire upper surface of the upper insulating film including the upper via hole and the upper silylation film; and
subjecting the upper metal layer to a chemical mechanical polishing process such that the upper silylation film is exposed, thereby forming an upper metal line.

7. The method of claim 4, wherein said forming the upper metal line layer over the lower metal line layer comprises:
forming an upper insulating film over an entire upper surface of the lower insulating film including the lower silylation film and the lower metal line;
patterning the upper insulating film on a first side of the upper insulating film such that the lower photoresist layer is exposed, thereby forming an upper hole;
forming an upper photoresist layer in the upper hole;
silylating the upper photoresist layer, thereby forming an upper silylation film;
patterning the upper insulating film on a second side of the upper insulating film, thereby forming an upper via hole;
forming an upper metal layer over an entire upper surface of the upper insulating film including the upper via hole and the upper silylation film; and
subjecting the upper metal layer to a chemical mechanical polishing process such that the upper silylation film is exposed, thereby forming an upper metal line.

8. The method of claim 7, wherein the upper metal layer is formed by an electro-chemical plating process.

9. The method of claim 7, wherein said forming at least one inductor line layer over the metal line layer comprises:
forming an insulating film over the metal line layer;
patterning the insulating film, thereby forming an inductor hole; and
forming an inductor metal layer over an entire upper surface of the insulating film such that the inductor metal layer fills the inductor hole; and
subjecting the inductor metal layer to a chemical mechanical polishing process, thereby forming an inductor line.

10. The method of claim 9, wherein said forming the space layer beneath the inductor metal line layer comprises:
patterning the insulating film, the upper silylation film, and the photoresist layers, thereby forming a photoresist removing hole extending to a portion of the lower photoresist layer through the insulating film and the upper silylation film; and
wet etching the photoresist layers through the photoresist removing hole, to remove the photoresist layers, thereby forming the space layer.

11. The method of claim 10, wherein the inductor line is patterned to have a spiral structure.

12. The method of claim 11, wherein the inductor metal layer is made of one of copper and aluminum.

13. An apparatus comprising:
a semiconductor substrate formed with a sub-structure;
a lower metal line layer formed over the semiconductor layer;
an upper metal line layer formed over the lower metal line layer, the upper metal line layer comprising an upper insulating film formed over the lower metal line, an upper hole formed in a first side of the upper insulating film, an upper photoresist layer formed in the upper hole, an upper silylation film formed over the upper photoresist layer, an upper via hole formed in a second side of the upper insulating film, and an upper metal line buried in the upper via hole;
at least one inductor line layer formed over the metal line layer; and
a space layer formed between the inductor line layer and the semiconductor substrate.

14. The apparatus of claim 13, wherein the lower metal line layer comprises:
a lower insulating film formed over the semiconductor substrate;
a lower hole formed on a first side of the lower insulating film;
a lower photoresist layer formed in the lower hole;
a lower silylation film formed over the lower photoresist layer;
a lower via hole formed on a second side of the lower insulating film; and
a lower metal line buried in the lower via hole.

* * * * *